(12) United States Patent
Kawanabe et al.

(10) Patent No.: US 12,525,472 B2
(45) Date of Patent: Jan. 13, 2026

(54) STRUCTURE AND HEATING DEVICE

(71) Applicant: KYOCERA Corporation, Kyoto (JP)

(72) Inventors: Yasunori Kawanabe, Kirishima (JP); Yoshihiro Komatsu, Satsumasendai (JP); Yoshihiro Okawa, Kirishima (JP)

(73) Assignee: KYOCERA Corporation, Kyoto (JP)

( * ) Notice: Subject to any disclaimer, the term of this patent is extended or adjusted under 35 U.S.C. 154(b) by 712 days.

(21) Appl. No.: 17/769,145

(22) PCT Filed: Sep. 25, 2020

(86) PCT No.: PCT/JP2020/036476
§ 371 (c)(1),
(2) Date: Apr. 14, 2022

(87) PCT Pub. No.: WO2021/075240
PCT Pub. Date: Apr. 22, 2021

(65) Prior Publication Data
US 2023/0141651 A1    May 11, 2023

(30) Foreign Application Priority Data
Oct. 18, 2019  (JP) .................. 2019-190776

(51) Int. Cl.
*H01L 21/67* (2006.01)
*H01L 21/683* (2006.01)
(Continued)

(52) U.S. Cl.
CPC ...... *H01L 21/67103* (2013.01); *H01L 21/683* (2013.01); *H05B 3/03* (2013.01); *H05B 3/265* (2013.01)

(58) Field of Classification Search
CPC ... H01L 21/67103; H01L 21/683–6833; H01L 21/68714–68792; H05B 3/03;
(Continued)

(56) References Cited
U.S. PATENT DOCUMENTS

| 7,090,423 B2 | 8/2006 | Natsuhara et al. |
| 8,193,629 B2 | 6/2012 | Takebayashi et al. |

(Continued)

FOREIGN PATENT DOCUMENTS

| JP | 2003-40686 A | 2/2003 |
| JP | 2003-245792 A | 9/2003 |

(Continued)

OTHER PUBLICATIONS

English translation of JP 2015-2300.*

*Primary Examiner* — Aiden Lee
(74) *Attorney, Agent, or Firm* — Procopio, Cory, Hargreaves & Savitch LLP

(57) ABSTRACT

Structures (2, 2A to 2P) according to the present disclosure have respective bases (10, 10A), electrode layers, and terminals. The bases (10, 10A) are made of a ceramic. The electrode layers (111, 111C, 111D, 111F, 111M, 111N, 111O) are located inside the respective bases (10, 10A). The terminals (41, 41G, 41H, 41I, 41J, 41K, 41L) are electrically connected to the respective electrode layers (111, 111C, 111D, 111F, 111M, 111N, 111O) at respective tip portions of the terminals. Further, the terminals (41, 41G, 41H, 41I, 41J, 41K, 41L) are in contact with the respective electrode layers (111, 111C, 111D, 111F, 111M, 111N, 111O) at respective tip surfaces and side surfaces of the terminals.

13 Claims, 34 Drawing Sheets

(51) Int. Cl.
   *H05B 3/03*   (2006.01)
   *H05B 3/26*   (2006.01)
   *H05B 3/28*   (2006.01)

(58) Field of Classification Search
   CPC .. H05B 3/265; H05B 2203/016; H05B 3/283; H01J 2237/332–3348; C23C 16/458–466
   See application file for complete search history.

(56) References Cited

U.S. PATENT DOCUMENTS

| | | |
|---|---|---|
| 11,205,584 B2 | 12/2021 | Takebayashi |
| 2003/0221854 A1* | 12/2003 | Natsuhara ............. C04B 37/005 174/50.61 |
| 2007/0221662 A1* | 9/2007 | Nishioka ................ H05B 3/143 219/544 |
| 2008/0116187 A1* | 5/2008 | Sugimoto .............. H05B 3/143 219/200 |
| 2009/0173448 A1* | 7/2009 | Fujii ................... H01L 21/6833 156/379.6 |
| 2009/0176065 A1* | 7/2009 | Takebayashi ....... H01L 21/6833 428/173 |
| 2012/0250211 A1* | 10/2012 | Kida ................... H01L 21/6833 361/234 |
| 2018/0108556 A1* | 4/2018 | Takebayashi ......... C04B 37/006 |
| 2019/0311934 A1* | 10/2019 | Tsuchida ................ C04B 37/02 |
| 2021/0265189 A1* | 8/2021 | Kawanabe ............ H05B 3/283 |
| 2023/0154781 A1* | 5/2023 | Kuno ................ H01L 21/67103 361/234 |
| 2023/0402306 A1* | 12/2023 | Watanabe ......... H01L 21/67778 |

FOREIGN PATENT DOCUMENTS

| | | |
|---|---|---|
| JP | 2004-087392 A | 3/2004 |
| JP | 2009-188394 A | 8/2009 |
| JP | 2015-002300 A | 1/2015 |
| JP | 2018-064055 A | 4/2018 |

* cited by examiner

STRUCTURE AND HEATING DEVICE

CROSS-REFERENCE TO RELATED APPLICATIONS

This application is national stage application of International Application No. PCT/JP2020/036476, filed on Sep. 25, 2020, which designates the United States, incorporated herein by reference, and which claims the benefit of priority from Japanese Patent Application No. 2019-190776, filed on Oct. 18, 2019, the entire contents of which are incorporated herein by reference.

TECHNICAL FIELD

The present disclosure relates to a structure and a heating device.

BACKGROUND ART

Substrates made of ceramics have superior heat resistance compared to metals and resins. For example, aluminum nitride-based ceramics have a high thermal conductivity, and thus may be used as a structure for placing or holding workpieces such as various elements and components during thermal treatment of the workpieces.

When a structure is used as a heater for thermal treatment of a workpiece, a power supply terminal is connected to an electrode layer in order to connect the electrode layer embedded inside the structure to a power supply.

CITATION LIST

Patent Literature

Patent Document 1: JP 2003-40686 A

SUMMARY OF INVENTION

A structure according to one aspect of the present disclosure includes a base, an electrode layer, and a terminal. The base is made of a ceramic. The electrode layer is located inside the base. The terminal is electrically connected to the electrode layer at a tip portion of the terminal. In addition, the terminal is in contact with the electrode layer at a tip surface and a side surface of the terminal.

DESCRIPTION OF EMBODIMENTS

Figure 1:
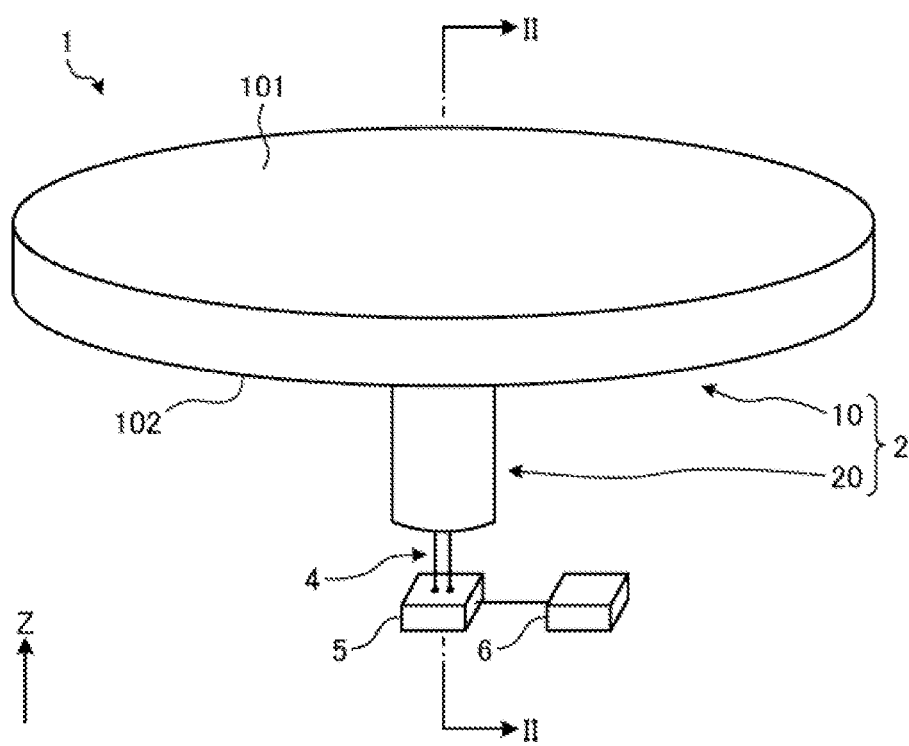
FIG. 1 is a schematic perspective view of a wafer placement device according to an embodiment.

Embodiments of a structure and a heating device according to the present disclosure (hereinafter, referred to as "embodiments") will be described in detail below with reference to the accompanying drawings. Note that the embodiments described below are not intended to limit the structure and the heating device according to the present disclosure. Each of the embodiments can be appropriately combined within a range in which the processing contents do not contradict each other. In each of the embodiments below, the same reference numerals are assigned to the same portions, and redundant descriptions thereof will be omitted.

In the embodiments described below, expressions such as "constant", "orthogonal", "vertical," and "parallel" may be used, but these expressions do not need to be exactly "constant", "orthogonal", "vertical," and "parallel". In other words, each of the above-described expressions allows for deviations in, for example, manufacturing accuracy, positioning accuracy, and the like.

Further, in each of the drawings referred to below, for ease of explanation, the vertical upward direction is defined as a Z axis direction.

Overall Configuration of Wafer Placement Device

First, a configuration of a wafer placement device according to an embodiment will be described with reference to FIG. 1. FIG. 1 is a schematic perspective view illustrating a wafer placement device 1 according to the embodiment.

The wafer placement device 1 according to the embodiment illustrated in FIG. 1 is a device for placing a semiconductor wafer, a crystal wafer, or another wafer (hereinafter, simply referred to as "wafer"). The wafer placement device 1 has a heating function for heating the placed wafer, and is mounted on, for example, a substrate processing device that performs plasma treatment or the like on the wafer.

As illustrated in FIG. 1, the wafer placement device 1 includes a structure 2, a wiring portion 4, an electric power supply unit 5, and a controller 6.

The structure 2 includes a base 10 that is disc-shaped and has a thickness in an up-down (Z axis) direction, and a cylindrical shaft 20 connected to the base 10. The wafer is placed on an upper surface 101 of the base 10. Further, the shaft 20 is connected to a lower surface 102 of the base 10. The upper surface 101 and the lower surface 102 of the base 10 have substantially the same shape, and both have a larger diameter than the wafer. An electrode layer (not illustrated here) as a heating element is located inside the base 10.

The wiring portion 4 electrically connects the electrode layer located inside the base 10 to the electric power supply unit 5 located outside the base 10. The electric power supply unit 5 is electrically connected to the electrode layer via the wiring portion 4, and supplies electric power to the electrode layer via the wiring portion 4. The electric power supply unit 5 includes a power supply circuit that converts electric power supplied from a power supply (not illustrated) to an appropriate voltage. The controller 6 controls the supply of electric power in the electric power supply unit 5.

The wafer placement device 1 is configured as described above, and heats the wafer placed on the wafer placement surface 101 by generating heat in the electrode layer inside the base 10 using the electric power supplied from the electric power supply unit 5.

Configuration of Structure

Figure 2:
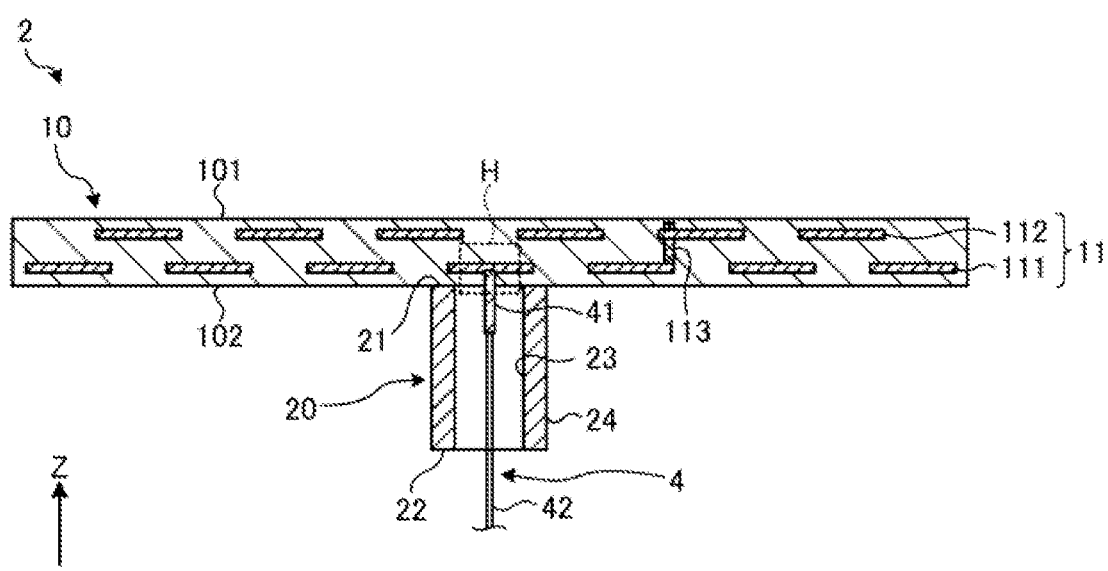
FIG. 2 is a schematic cross-sectional view of a structure according to the embodiment.

Next, a configuration of the structure 2 will be described with reference to FIG. 2. FIG. 2 is a schematic cross-sectional view of the structure 2 according to the embodiment. Note that FIG. 2 illustrates a schematic cross-sectional view taken along a line II-II illustrated in FIG. 1.

Base

As illustrated in FIG. 2, an electrode layer 11 is located inside the base 10. In the present embodiment, the electrode layer 11 includes a first electrode layer 111 and a second electrode layer 112. The first electrode layer 111 is an electrode layer located relative to the lower surface 102 side of the base 10. The second electrode layer 112 is an electrode layer located relative to the upper surface 101 (hereinafter, may be referred to as "wafer placement surface 101") side of the base 10 in relation to the first electrode layer 111. The first electrode layer 111 and the second electrode layer 112 are made of, for example, a metal such as Ni, W, Mo, or Pt, or an alloy containing at least one of the above metals.

The first electrode layer 111 and the second electrode layer 112 extend along the wafer placement surface 101. Specifically, the first electrode layer 111 and the second electrode layer 112 are arranged over substantially the entire surface of the wafer placement surface 101 while drawing a predetermined pattern such as a spiral pattern or a meandering pattern. The thickness of the first electrode layer 111 and the second electrode layer 112 is, for example, 30 μm to 120 μm.

The first electrode layer 111 and the second electrode layer 112 are electrically connected to each other through a via conductor 113. Note that the electrode layer 11 does not necessarily have to include two layers, but may include at least one layer (e.g., the first electrode layer 111).

The base 10 is made of a ceramic. A main component of the ceramic constituting the base 10 is, for example, aluminum nitride (AlN), aluminum oxide ($Al_2O_3$, alumina), silicon carbide (SiC), or silicon nitride ($Si_3N_4$). The main component here is, for example, a material that occupies 50 mass % or more or 80 mass % or more of the material.

Note that in addition to the ceramic described above, the base 10 may contain, for example, a sintering aid. Examples of the sintering aid include a mixture of calcium oxide (CaO) and yttrium oxide ($Y_2O_3$).

The upper surface 101 (wafer placement surface 101) and the lower surface 102 of the base 10 are parallel to each other. Further, the shape of the base 10 is not limited to any particular shape. For example, in the embodiment, the shape of the base 10 is a circular shape in a plan view, but the shape of the base 10 is not limited thereto, and may be an elliptical shape, a rectangular shape, a trapezoidal shape, or the like in a plan view. Dimensions of the base 10, as an example, are 20 cm to 35 cm in diameter and 4 mm to 30 mm in thickness.

Shaft

The shaft 20 has a cylindrical shape, and an upper end thereof is bonded to a central portion of the lower surface of the base 10. As one specific method, the shaft 20 is bonded (adhered) to the lower surface 102 of the base 10 by an adhesive. As another specific method, the shaft 20 may be bonded to the base 10 by solid-phase bonding. The shape of the shaft 20 is not limited to any particular shape. As one specific shape, the shaft 20 has a cylindrical shape. As another specific shape, the shaft 20 may have, for example, a square cylinder shape. The material of the shaft 20 is not limited to any particular material. As one specific material, the material of the shaft 20 is a ceramic having insulating properties. As another specific material, the material of the shaft 20 may be, for example, a conductive material (metal).

The cylindrical shaft 20 has an upper surface 21 that is bonded to the lower surface 102 of the base 10, a lower surface 22 that is located opposite to the upper surface 21, an inner surface 23 that connects the upper surface 21 and the lower surface 22 and constitutes an inner side of the shaft 20, and an outer surface 24 that connects the upper surface 21 and the lower surface 22 and constitutes an outer side of the shaft 20.

In the illustrated example, the inner surface 23 is provided parallel to the outer surface 24 along the direction in which the shaft 20 extends. In another perspective, the inner surface 23 is provided parallel to a straight line parallel to the thickness direction of the base 10. However, the inner surface 23 may be inclined so that the inner diameter of the shaft 20 decreases downward, or may be inclined so that the inner diameter of the shaft 20 increases downward. Note that the outer surface 24 can be similarly configured. This allows the shaft 20 to be continuously different in at least one of the inner and outer diameters from the upper end to the lower end.

Wiring Portion

The wiring portion 4 includes a terminal 41 and lead wires 42. The terminal 41 is a metal (bulk material) having some length in the up-down direction. An upper end portion of the terminal 41 is located inside the base 10, and a lower end portion of the terminal 41 is located outside the base 10. In the illustrated example, the terminal 41 is electrically connected to the first electrode layer 111. The terminal 41 is also electrically connected to the second electrode layer 112 through the via conductor 113. The shape of the terminal 41 is not limited to any particular shape. In one specific example, the terminal 41 has a cylindrical shape. The terminal 41 is made of, for example, a metal such as Ni, W, Mo, or Pt, or an alloy containing at least one of the above metals.

Internal Configuration of Base

Figure 3:
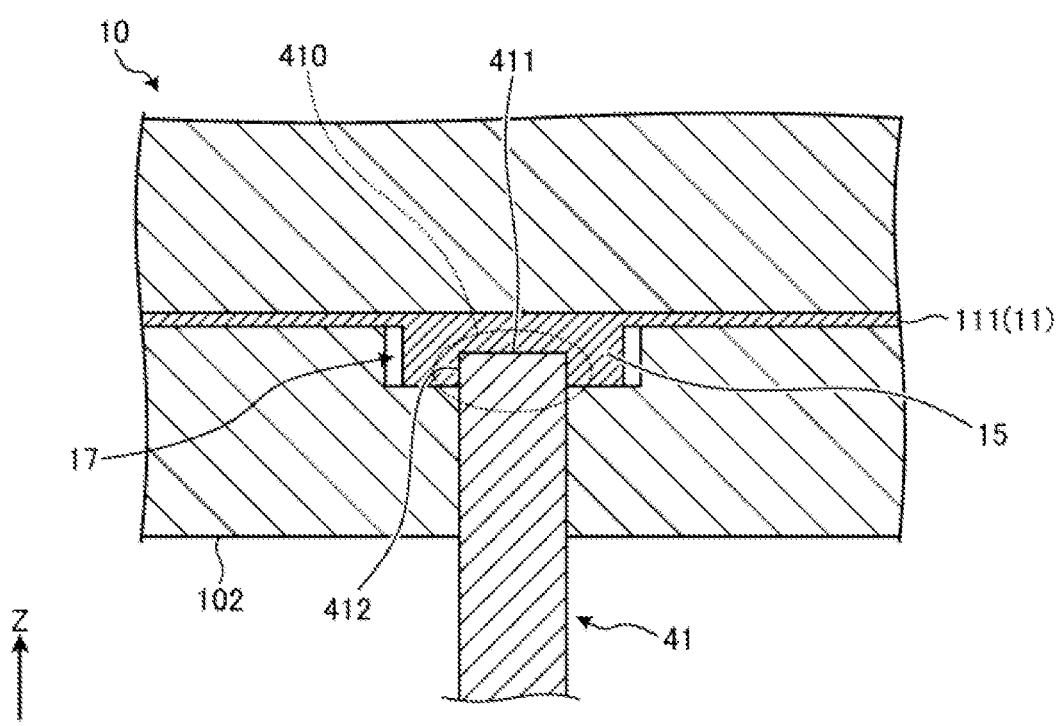
FIG. 3 is a schematic enlarged view of an H portion illustrated in FIG. 2.

Next, an internal configuration of the base 10 described above will be specifically described with reference to FIG. 3. FIG. 3 is a schematic enlarged view of an H portion illustrated in FIG. 2.

As illustrated in FIG. 3, the terminal 41 is electrically connected to the electrode layer 11 (here, the first electrode layer 111) at a tip portion 410 thereof. Specifically, the terminal 41 is in contact with the first electrode layer 111 at a tip surface 411 thereof and a side surface 412 thereof.

When a structure made of a ceramic is used as a heater for thermal treatment of a workpiece, a power supply terminal is connected to an electrode layer in order to connect the electrode layer embedded inside the structure with a power supply. In the related art, there is room for further improvement in such a structure in terms of improving the bonding strength between the terminal and the electrode layer.

The terminal 41 according to the embodiment is in contact with the first electrode layer 111 at the tip surface 411 thereof and the side surface 412 thereof. Thus, the bonding strength between the terminal 41 and the first electrode layer 111 can be improved compared to a case in which, for example, the terminal 41 is in contact with the first electrode layer 111 only at the tip surface 411 thereof or only at the side surface 412 thereof.

The terminal 41 and the first electrode layer 111 are bonded, for example, by heat-shrinking the first electrode layer 111 to adhere to the terminal 41 in a manufacturing process of the base 10. Further, the terminal 41 and the first electrode layer 111 may also be bonded by interposing a sealant (not illustrated) in a minute gap between the terminal 41 and the first electrode layer 111. The sealant contains, for example, aluminum oxide ($Al_2O_3$) as a main component, and calcium oxide (CaO) and yttrium oxide ($Y_2O_3$).

The first electrode layer 111 to be connected to the terminal 41 has a contact portion 15 at a portion in contact with the terminal 41. The contact portion 15 is a part of the first electrode layer 111, and a thickness (width in the up-down direction) thereof is thicker than that of other portions in the first electrode layer 111. Specifically, the contact portion 15 protrudes toward the lower surface 102 side, that is, toward the opposite side of the wafer placement surface 101, compared to the other portions of the first electrode layer 111. As an example, the thickness of the contact portion 15 (maximum thickness excluding a recessed portion 151 described later) is 0.4 mm to 3 mm, preferably 0.6 mm to 2 mm.

In this way, by making the contact portion 15, which is the contact portion with the terminal 41, thicker than the other portions, the contact area with the side surface 412 of the terminal 41 can be made larger. Thus, the bonding strength between the terminal 41 and the first electrode layer 111 can be further improved. In addition, as will be described in detail later, when forming a recessed portion for housing the tip portion 410 of the terminal 41 using a drill or the like in the first electrode layer 111 in the manufacturing process of the base 10, it is possible to reduce the likelihood of the drill or the like accidentally passing through the first electrode layer 111. That is, the manufacturing process of the base 10 can be facilitated.

Further, the base 10 has a space 17 around the contact portion 15. The space 17 extends to a side of the contact portion 15, and surrounds the entire circumference of the contact portion 15. By providing the space 17 around the contact portion 15 in this manner, it is possible to suppress the heat transfer to the opposite side of the wafer placement surface 101 due to the insulating effect of the space 17. Thus, it is possible to efficiently heat the wafer placed on the wafer placement surface 101.

Manufacturing Method for Base According to Embodiment

Next, an example of a manufacturing method for the base 10 will be described with reference to FIGS. 4 to 9. FIGS. 4 to 9 are schematic cross-sectional views for describing the example of the manufacturing method for the base 10 according to the embodiment.

Figure 4:
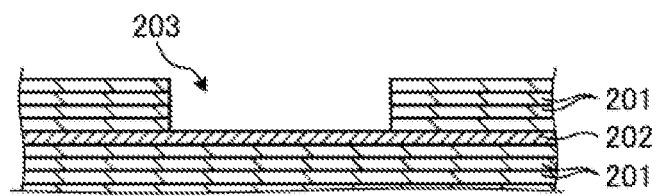
FIG. 4 is a schematic cross-sectional view for describing an example of a manufacturing method for a base according to the embodiment.

As illustrated in FIG. 4, first, a plurality of ceramic green sheets 201 containing aluminum nitride (AlN) or the like as a main component are layered on one another. On top of that, one (or a plurality of) metal sheet 202 made of a metal or alloy such as tungsten (W), which constitutes the first electrode layer 111, is layered, and then a plurality of ceramic green sheets 201 are further layered thereon. The plurality of ceramic green sheets 201 layered on the metal sheet 202 are preliminarily formed with an opening 203 for positioning the contact portion 15 described above.

Figure 5:
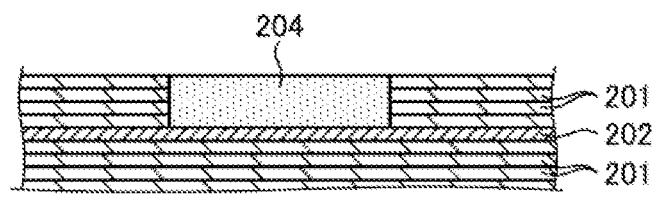
FIG. 5 is a schematic cross-sectional view for describing the example of the manufacturing method for the base according to the embodiment.
Figure 6:
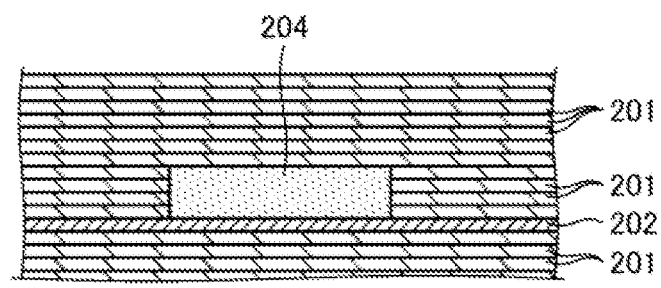
FIG. 6 is a schematic cross-sectional view for describing the example of the manufacturing method for the base according to the embodiment.

Subsequently, as illustrated in FIG. 5, the opening 203 is filled with tungsten carbide (WC) paste 204. Note that the paste 204 may be one that is eventually integrated with the first electrode layer 111, and does not necessarily have to be tungsten carbide. The paste 204 filled in the opening 203 is dried in the opening 203. Subsequently, as illustrated in FIG. 6, a plurality of ceramic green sheets 201 are further layered thereon.

Figure 7:
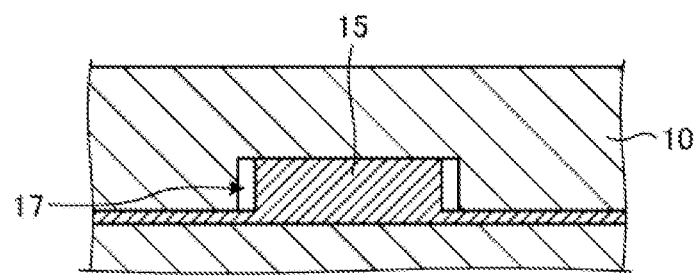
FIG. 7 is a schematic cross-sectional view for describing the example of the manufacturing method for the base according to the embodiment.

Subsequently, the laminate is then fired at a temperature of 1700 to 1800° C., for example, under a nitrogen atmosphere. As a result, as illustrated in FIG. 7, the paste 204 is integrated with the first electrode layer 111 to form the contact portion 15. In addition, the space 17 is formed on the side of the contact portion 15 due to the shrinkage of the paste 204.

Figure 8:
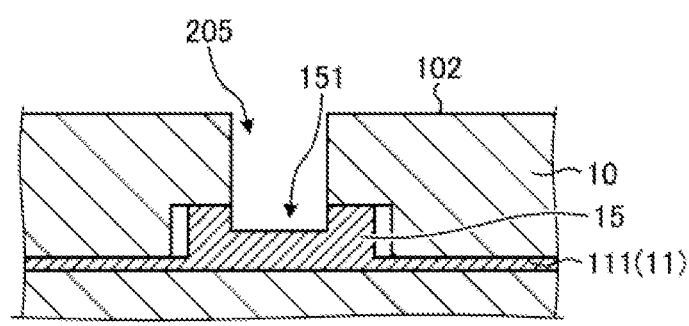
FIG. 8 is a schematic cross-sectional view for describing the example of the manufacturing method for the base according to the embodiment.

Subsequently, as illustrated in FIG. 8, an opening 205 is formed in the base 10. The opening 205 is formed by using, for example, a drill or the like so as to extend in the up-down direction from the lower surface 102 toward the wafer placement surface 101 (see FIG. 2, etc.) of the base 10. At this time, a part of the contact portion 15 is also drilled by the drill or the like as well as the base 10. This forms a recessed portion 151 in a part of the contact portion 15 that is recessed in the thickness direction of the contact portion 15.

Figure 9:
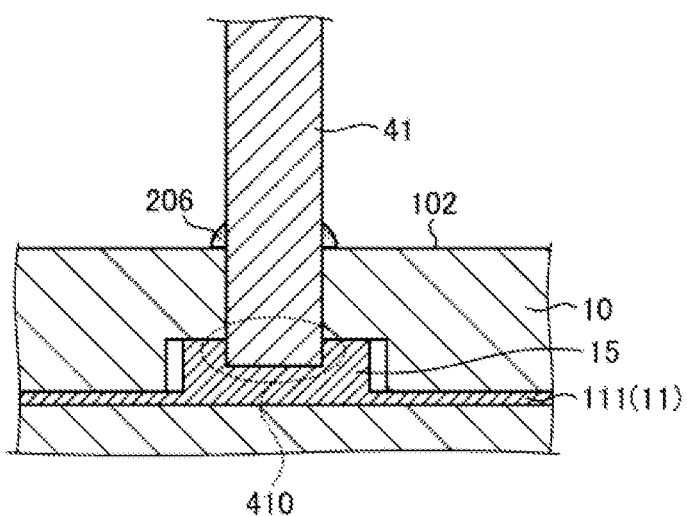
FIG. 9 is a schematic cross-sectional view for describing the example of the manufacturing method for the base according to the embodiment.

Subsequently, as illustrated in FIG. 9, the terminal 41 is inserted into the opening 205 (see FIG. 8). This positions the tip portion 410 of the terminal 41 inside the recessed portion 151 of the contact portion 15. Subsequently, a sealant 206 is applied around the terminal 41. Thereafter, the base 10 is thermally treated, for example, at 1550° C. in a vacuum. This allows the sealant 206 to enter a gap between the terminal 41 and the opening 205 by capillary action, thereby sealing the gap between the terminal 41 and the opening 205. Further, the terminal 41 and the first electrode layer 111 are bonded to each other.

Note that, before inserting the terminal 41 into the opening 205, a paste containing metal fine particles of Pt (platinum) or Ni (nickel) as a main component may be applied to a tip of the terminal 41 (on a side in contact with the recessed portion 151). By applying Pt paste or Ni paste to the tip of the terminal 41 and then inserting the terminal 41 into the opening 205, the terminal 41 and the recessed portion 151 (contact portion 15) are bonded with Pt or Ni interposed therebetween. This increases the bonding strength between the terminal 41 and the contact portion 15, thereby increasing the reliability of the bonding between the terminal 41 and the contact portion 15.

First Modification Example

Figure 10:
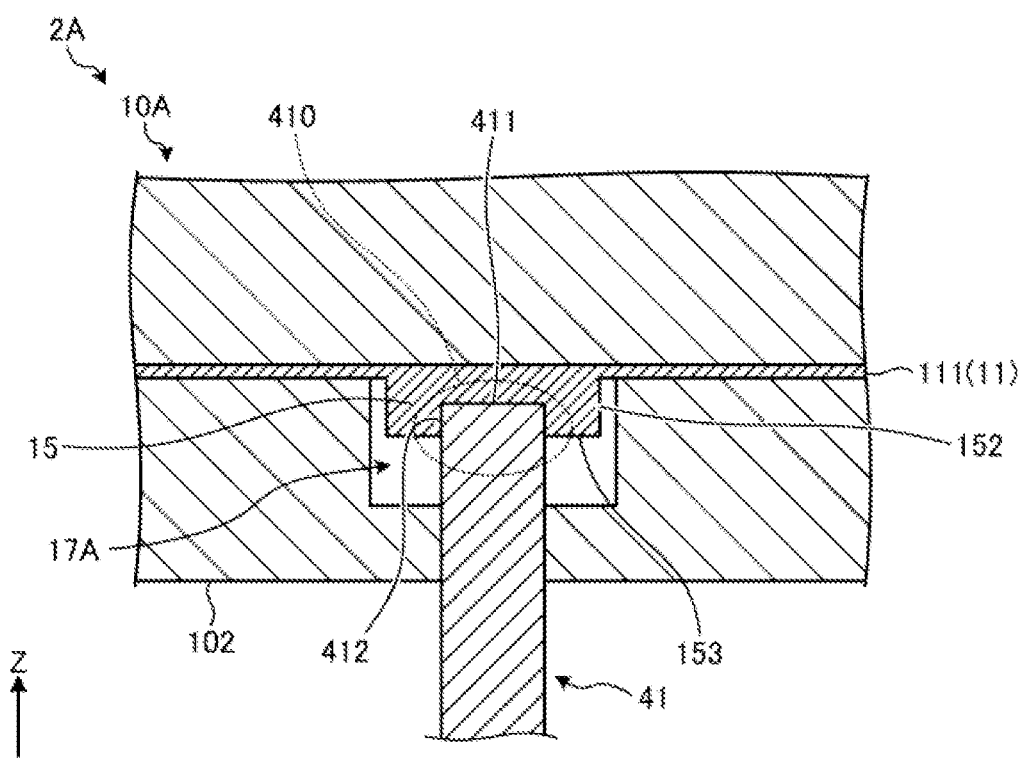
FIG. 10 is a schematic cross-sectional view of a structure according to a first modification example.

Next, a modification example of the structure 2 according to the above-described embodiment will be described. First, a structure according to a first modification example will be described with reference to FIG. 10. FIG. 10 is a schematic cross-sectional view of the structure according to the first modification example.

As illustrated in FIG. 10, a structure 2A according to the first modification example includes a base 10A. The base 10A has a space 17A larger than the space 17 that the base 10 according to the above-described embodiment has. Specifically, whereas the space 17 that the base 10 according to the above-described embodiment has extends only to the side of the contact portion 15, the space 17A extends to the side and also in the protruding direction (here, in the negative direction of the Z axis) of the contact portion 15. In other words, the space 17A is interposed between a side surface 152 of the contact portion 15 and the base 10A, and is also interposed between a protruding surface 153 (an end surface protruding more than other portions of the first electrode layer 111) of the contact portion 15 and the base 10A.

As described above, by having the space 17A around the contact portion 15 that extends to the side and in the protruding direction of the contact portion 15, it is possible to further suppress heat transfer to the opposite side of the wafer placement surface 101 due to the insulating effect of the space 17A. In addition, as will be described later, in a manufacturing process of the base 10A, the work of forming the recessed portion 151 in the contact portion 15 can be facilitated.

Manufacturing Method for Base According to First Modification Example

Next, a manufacturing method for the base 10A according to the first modification example will be described with reference to FIGS. 11 to 15. FIGS. 11 to 15 are schematic cross-sectional views for describing an example of the manufacturing method for the base 10A according to the first modification example.

Figure 11:
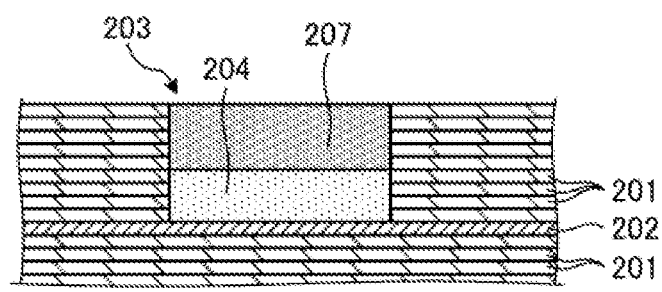
FIG. 11 is a schematic cross-sectional view for describing an example of a manufacturing method for a base according to the first modification example.
Figure 12:
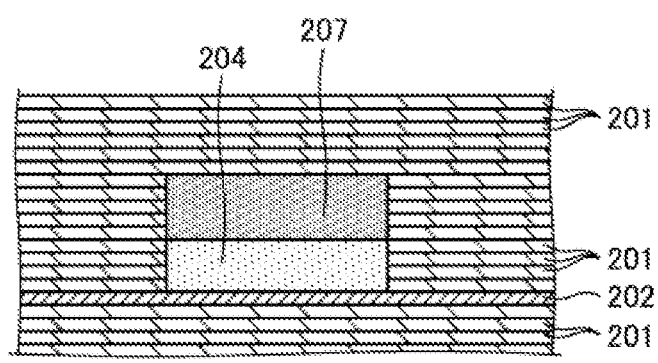
FIG. 12 is a schematic cross-sectional view for describing the example of the manufacturing method for the base according to the first modification example.

As illustrated in FIG. 11, after a plurality of ceramic green sheets 201 and the metal sheet 202 are layered in a procedure similar to that for the base 10 according to the above-described embodiment, the opening 203 is filled with the tungsten carbide (WC) paste 204. The paste 204 fills the opening 203, leaving some space. Subsequently, after the opening 203 is further filled with a resin 207, a plurality of ceramic green sheets 201 are further layered thereon as illustrated in FIG. 12.

Figure 13:
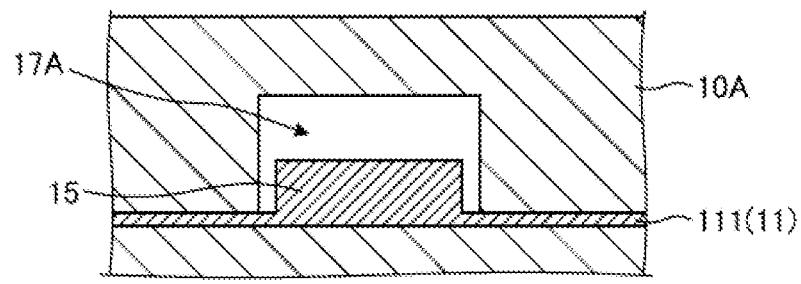
FIG. 13 is a schematic cross-sectional view for describing the example of the manufacturing method for the base according to the first modification example.

Subsequently, the laminate is then fired at a temperature of 1700 to 1800° C., for example, under a nitrogen atmosphere. As a result, as illustrated in FIG. 13, the paste 204 is integrated with the first electrode layer 111 to form the contact portion 15. In addition, in this step, the space 17A is formed around the contact portion 15 due to the shrinkage of the paste 204 and the burning of the resin 207.

Although it is possible to form the space 17A without filling the opening 203 (see FIG. 11) with the resin 207, filling the opening 203 with the resin 207 can suppress the distortion of the base 10A after firing. Specifically, since the shrinkage rate of the paste 204 is larger than that of others, the region around the paste 204 (contact portion 15) is easily distorted by firing, but by filling the opening 203 with the resin 207, such distortion can be suppressed.

Figure 14:
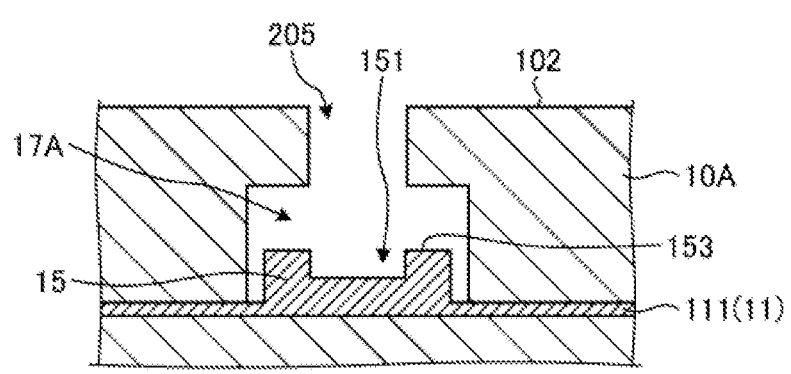
FIG. 14 is a schematic cross-sectional view for describing the example of the manufacturing method for the base according to the first modification example.

Subsequently, as illustrated in FIG. 14, the opening 205 is formed in the base 10A. The opening 205 is formed by using, for example, a drill or the like so as to extend in the up-down direction from the lower surface 102 toward the wafer placement surface 101 (see FIG. 2, etc.) of the base 10A. As a result, first, the outside of the base 10A and the space 17A inside the base 10A communicate with each other through the opening 205. Subsequently, the protruding surface 153 of the contact portion 15 is drilled by a drill or the like to form the recessed portion 151 in a part of the contact portion 15 that is recessed in the thickness direction of the contact portion 15. At this time, since the space 17A is interposed between the opening 205 and the protruding surface 153 of the contact portion 15, it is easy for the operator to visually confirm the protruding surface 153 of the contact portion 15 through the opening 205. Thus, positioning of the recessed portion 151 can be easily performed.

Figure 15:
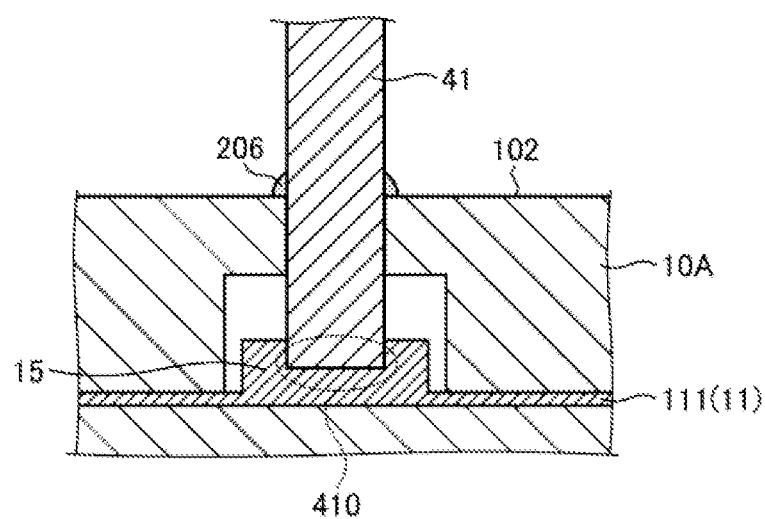
FIG. 15 is a schematic cross-sectional view for describing the example of the manufacturing method for the base according to the first modification example.

Subsequently, as illustrated in FIG. 15, the terminal 41 is inserted into the opening 205. This positions the tip portion 410 of the terminal 41 inside the recessed portion 151 of the contact portion 15. Subsequently, the sealant 206 is applied around the terminal 41. Thereafter, the base 10A is thermally treated, for example, at 1550° C. in a vacuum. This allows the sealant 206 to enter the gap between the terminal 41 and the opening 205 by capillary action, thereby sealing the gap between the terminal 41 and the opening 205. Further, the terminal 41 and the first electrode layer 111 are bonded to each other.

Second Modification Example

Figure 16:
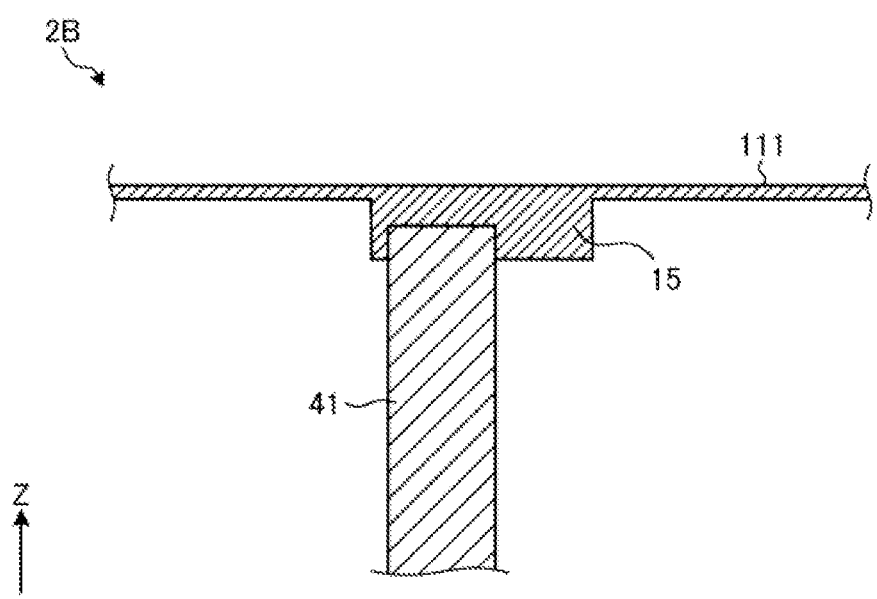
FIG. 16 is a schematic cross-sectional view of a structure according to a second modification example.

Next, a structure according to a second modification example will be described with reference to FIG. 16. FIG. 16 is a schematic cross-sectional view of the structure according to the second modification example. Note that in FIG. 16 and FIGS. 17 to 27, which will be described later, only the first electrode layer and the terminal are illustrated, and other configurations are omitted from the figures.

As illustrated in FIG. 16, in a structure 2B according to the second modification example, the terminal 41 is connected at a position offset from a center position of the contact portion 15. In this way, the terminal 41 does not necessarily have to be connected to the center position of the contact portion 15.

Third Modification Example

Figure 17:
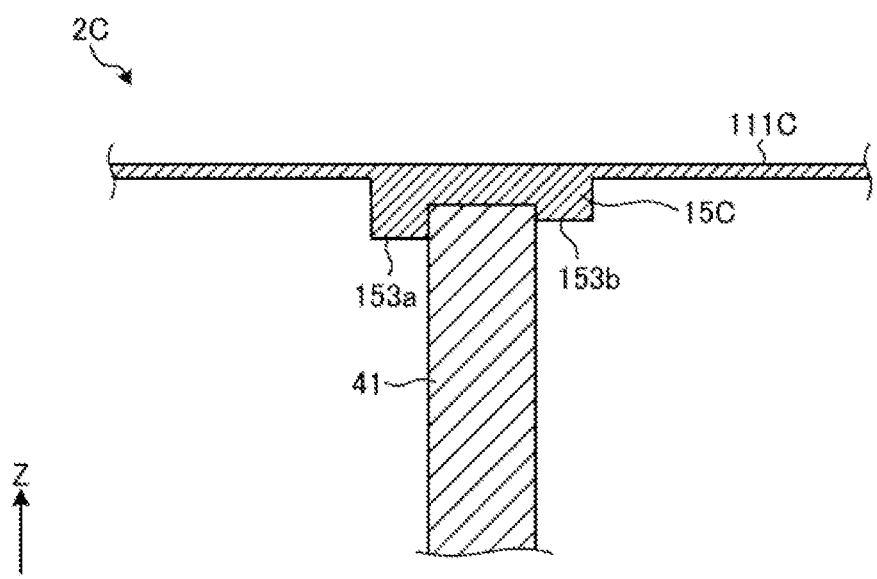
FIG. 17 is a schematic cross-sectional view of a structure according to a third modification example.

Next, a structure according to a third modification example will be described with reference to FIG. 17. FIG. 17 is a schematic cross-sectional view of the structure according to the third modification example.

As illustrated in FIG. 17, a structure 2C according to the third modification example has a first electrode layer 111C. A contact portion 15C of the first electrode layer 111C according to the third modification example has a plurality of protruding surfaces 153a and 153b having different protruding heights. Thus, the protruding surfaces 153a and 153b of the contact portion 15C do not necessarily have to be the same surface.

Fourth Modification Example

Figure 18:
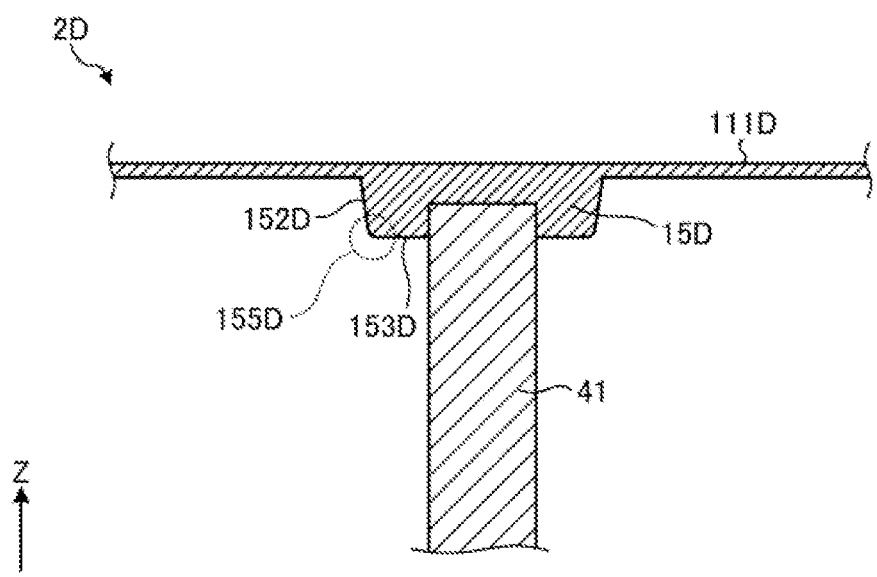
FIG. 18 is a schematic cross-sectional view of a structure according to a fourth modification example.

Next, a structure according to a fourth modification example will be described with reference to FIG. 18. FIG. 18 is a schematic cross-sectional view of the structure according to the fourth modification example.

As illustrated in FIG. 18, a structure 2D according to the fourth modification example includes a first electrode layer 111D. A contact portion 15D of the first electrode layer 111D according to the fourth modification example has a curved corner portion 155D between a side surface 152D and a protruding surface 153D. In this way, by making the corner portion 155D of the contact portion 15D curved, stress concentration on the contact portion 15D can be reduced.

Fifth Modification Example

Figure 19:
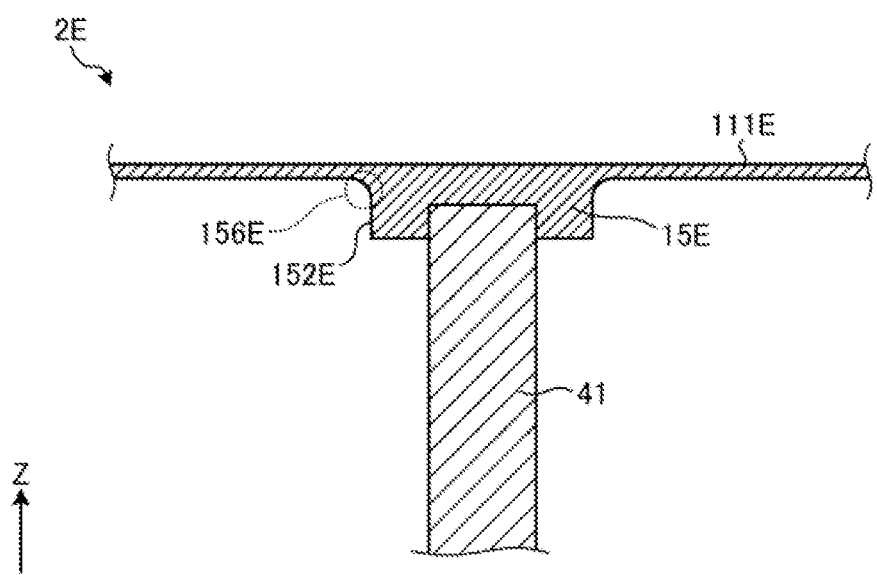
FIG. 19 is a schematic cross-sectional view of a structure according to a fifth modification example.

Next, a structure according to a fifth modification example will be described with reference to FIG. 19. FIG. 19 is a schematic cross-sectional view of the structure according to the fifth modification example.

As illustrated in FIG. 19, a structure 2E according to the fifth modification example includes a first electrode layer 111E. A contact portion 15E of the first electrode layer 111E according to the fifth modification example has a curved corner portion 156E between a side surface 152E and another portion of the first electrode layer 111E. In this way, by making the corner portion 156E of the contact portion 15E curved, stress concentration on the contact portion 15E can be reduced.

Sixth Modification Example

Figure 20:
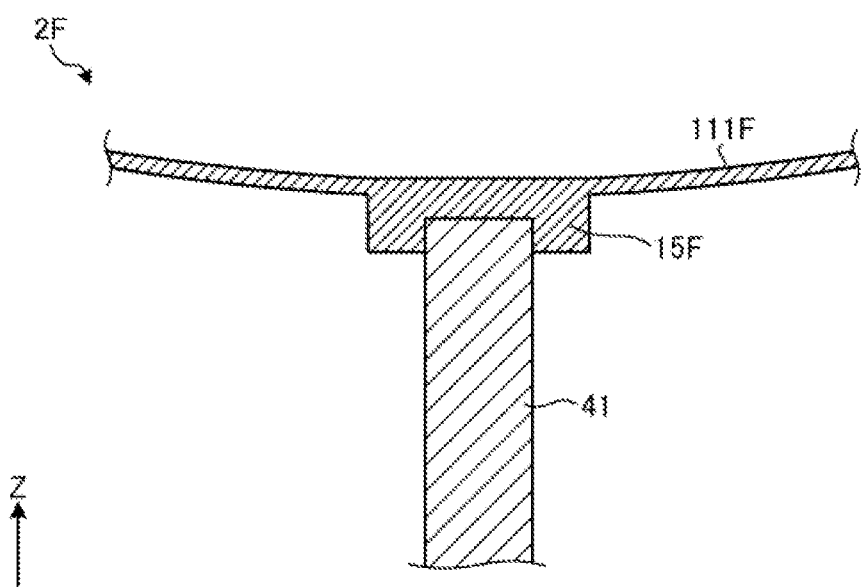
FIG. 20 is a schematic cross-sectional view of a structure according to a sixth modification example.

Next, a structure according to a sixth modification example will be described with reference to FIG. 20. FIG. 20 is a schematic cross-sectional view of the structure according to the sixth modification example.

As illustrated in FIG. 20, a structure 2F according to the sixth modification example includes a first electrode layer 111F. The first electrode layer 111F according to the sixth modification example is curved toward the terminal 41 with a contact portion 15F as the center. In this way, the first electrode layer 111F is curved toward the terminal 41, making it easier for the first electrode layer 111F to resist the pressing force by the terminal 41. This makes the bond between the terminal 41 and the first electrode layer 111F more reliable.

The first electrode layer 111F only needs to be curved toward the terminal 41 at least in some region including the contact portion 15F, and does not necessarily have to be curved on the whole.

In addition, although an example in which the first electrode layer 111F is curved toward the terminal 41 is described here, the first electrode layer 111F may be curved toward the wafer placement surface 101, for example.

Seventh Modification Example

Figure 21:
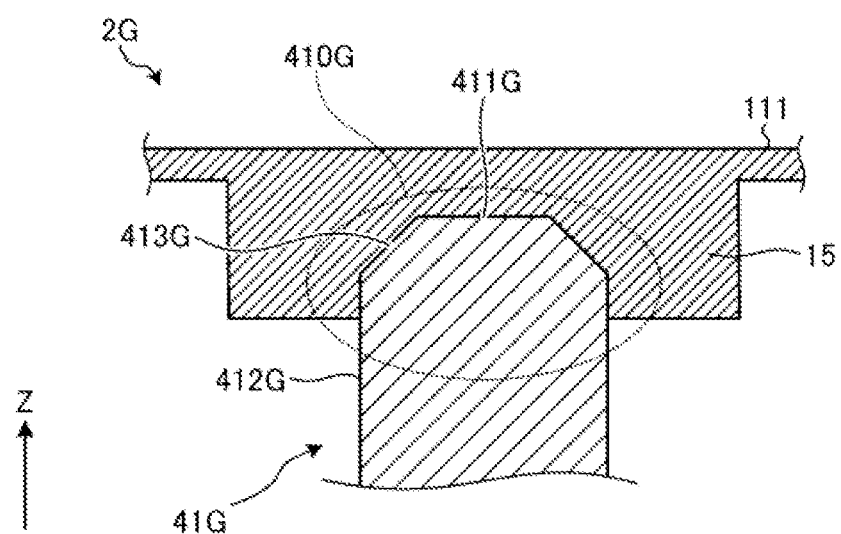
FIG. 21 is a schematic cross-sectional view of a structure according to a seventh modification example.

Next, a structure according to a seventh modification example will be described with reference to FIG. 21. FIG. 21 is a schematic cross-sectional view of the structure according to the seventh modification example.

As illustrated in FIG. 21, a structure 2G according to the seventh modification example includes a terminal 41G. The terminal 41G according to the seventh modification example has a reduced diameter portion 413G that decreases in diameter from a side surface 412G toward a tip surface 411G between the tip surface 411G and the side surface 412G. For example, the reduced diameter portion 413G according to the seventh modification example is a chamfered corner portion located between the tip surface 411G and the side surface 412G of the terminal 41G. Here, a case in which the reduced diameter portion 413G has a chamfered surface is illustrated, but the reduced diameter portion 413G may have a rounded surface.

In this way, by providing the reduced diameter portion 413G at a tip portion 410G of the terminal 41G, the contact area between the tip portion 410G of the terminal 41G and the contact portion 15 can be increased. Thus, the bonding strength between the terminal 41G and the first electrode layer 111 can be further improved.

Eighth Modification Example

Figure 22:
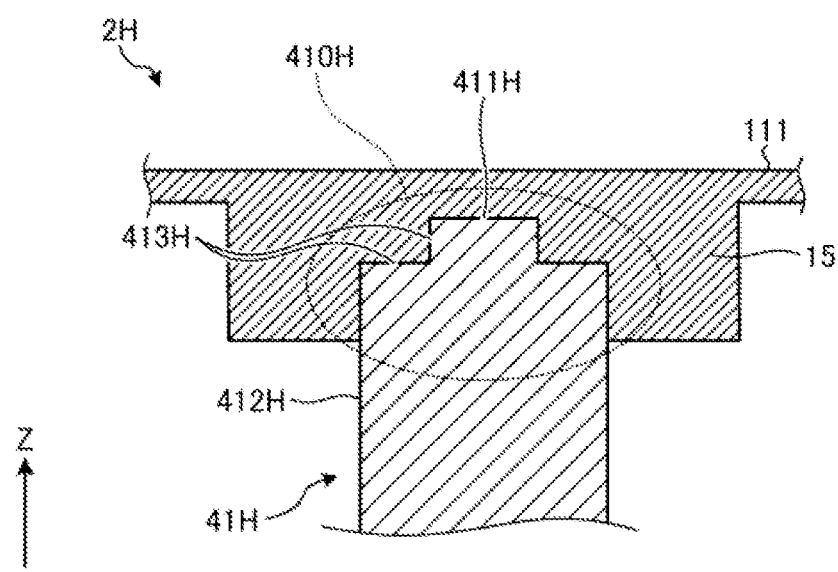
FIG. 22 is a schematic cross-sectional view of a structure according to an eighth modification example.

Next, a structure according to an eighth modification example will be described with reference to FIG. 22. FIG. 22 is a schematic cross-sectional view of the structure according to the eighth modification example.

As illustrated in FIG. 22, a structure 2H according to the eighth modification example includes a terminal 41H. The terminal 41H according to the eighth modification example has a reduced diameter portion 413H that decreases in diameter from a side surface 412H toward a tip surface 411H. The reduced diameter portion 413H according to the eighth modification example is a stepped portion located between the tip surface 411H and the side surface 412H.

In this way, by providing the reduced diameter portion 413H having a stepped shape at a tip portion 410H of the terminal 41H, the bonding strength between the terminal 41H and the first electrode layer 111 can be further improved.

Ninth Modification Example

Figure 23:
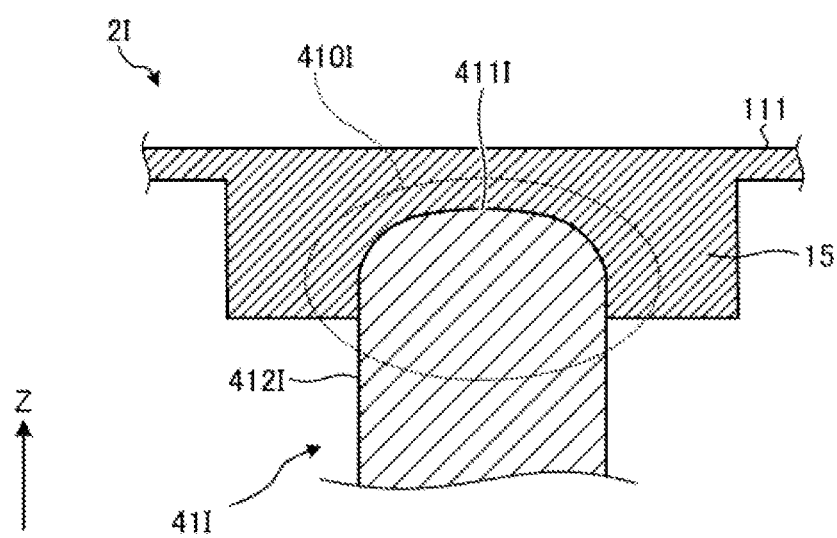
FIG. 23 is a schematic cross-sectional view of a structure according to a ninth modification example.

Next, a structure according to a ninth modification example will be described with reference to FIG. 23. FIG. 23 is a schematic cross-sectional view of the structure according to the ninth modification example.

As illustrated in FIG. 23, a structure 2I according to the ninth modification example includes a terminal 41I. The terminal 41I according to the ninth modification example has a tip surface 411I having a curved surface. In this way, by making the tip surface 411I of the terminal 41I curved, the contact area between a tip portion 410I of the terminal 41I and the contact portion 15 can be increased. Thus, the bonding strength between the terminal 41I and the first electrode layer 111 can be further improved.

10th Modification Example

Figure 24:
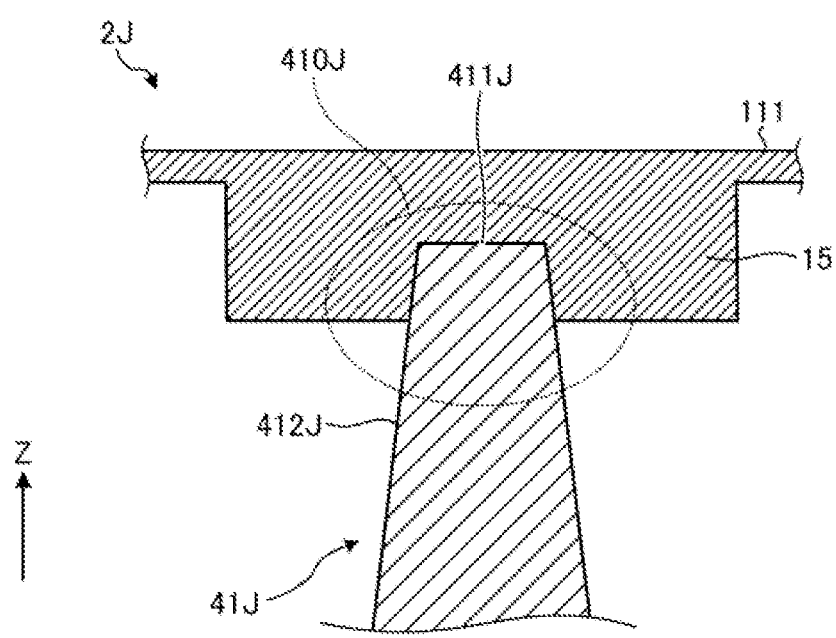
FIG. 24 is a schematic cross-sectional view of a structure according to a 10th modification example.

Next, a structure according to a 10th modification example will be described with reference to FIG. 24. FIG. 24 is a schematic cross-sectional view of the structure according to the 10th modification example.

As illustrated in FIG. 24, a structure 2J according to the 10th modification example includes a terminal 41J. The terminal 41J according to the 10th modification example has a tapered shape in which a side surface 412J decreases in diameter toward a tip surface 411J. In this way, by making a tip portion 410J of the terminal 41J tapered, the contact area between the tip portion 410J of the terminal 41J and the contact portion 15 can be increased. Thus, the bonding strength between the terminal 41J and the first electrode layer 111 can be further improved.

11th Modification Example

Figure 25:
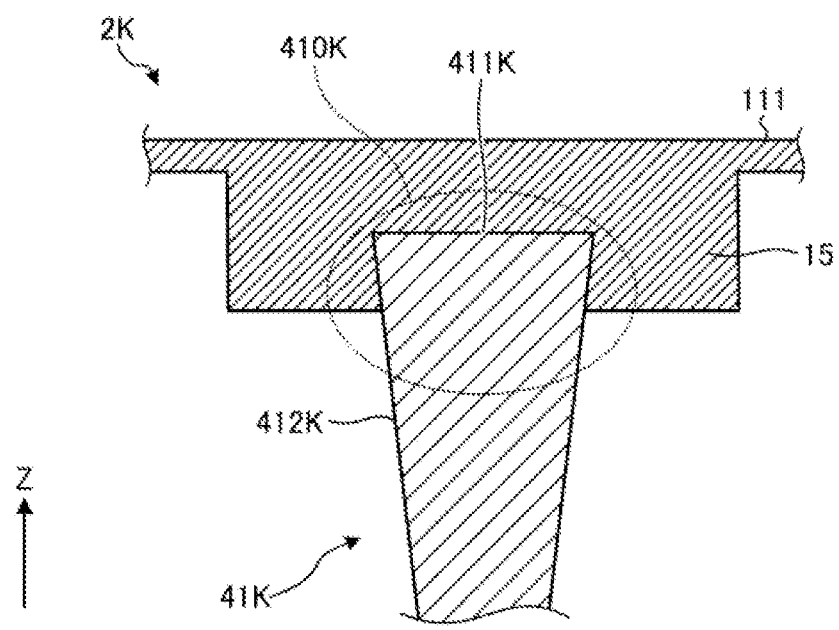
FIG. 25 is a schematic cross-sectional view of a structure according to an 11th modification example.

Next, a structure according to an 11th modification example will be described with reference to FIG. 25. FIG. 25 is a schematic cross-sectional view of the structure according to the 11th modification example.

As illustrated in FIG. 25, a structure 2K according to the 11th modification example includes a terminal 41K. The terminal 41K according to the 11th modification example has a reverse tapered shape in which a side surface 412K increases in diameter toward a tip surface 411K. In this way, by making a tip portion 410K of the terminal 41K have a reverse tapered shape, the contact area between the tip portion 410K of the terminal 41K and the contact portion 15 can be increased. Thus, the bonding strength between the terminal 41K and the first electrode layer 111 can be further improved. In addition, the reverse tapered shape suppresses the separation of the terminal 41K.

12th Modification Example

Figure 26:
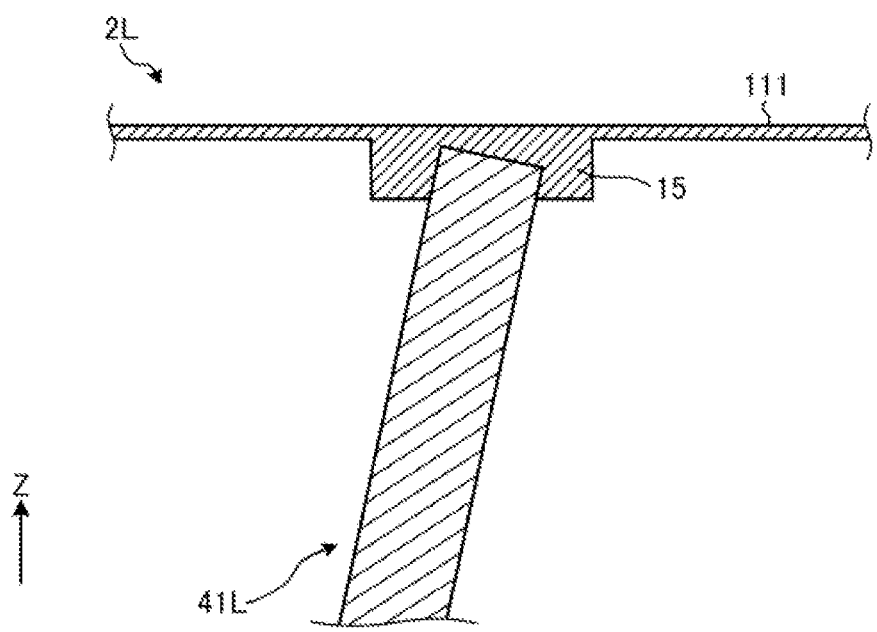
FIG. 26 is a schematic cross-sectional view of a structure according to a 12th modification example.

Next, a structure according to a 12th modification example will be described with reference to FIG. 26. FIG. 26 is a schematic cross-sectional view of the structure according to the 12th modification example.

As illustrated in FIG. 26, a terminal 41L according to the 12th modification example extends diagonally with respect to the protruding direction of the contact portion 15 (here, the Z axis direction). In this way, the terminal 41L may extend diagonally with respect to the protruding direction of the contact portion 15, in other words, the thickness direction of the base (up-down direction). This allows the thermal expansion of the terminal 41L to be shifted in the right-left direction, thereby suppressing the cracks in the base.

13th Modification Example

Figure 27:
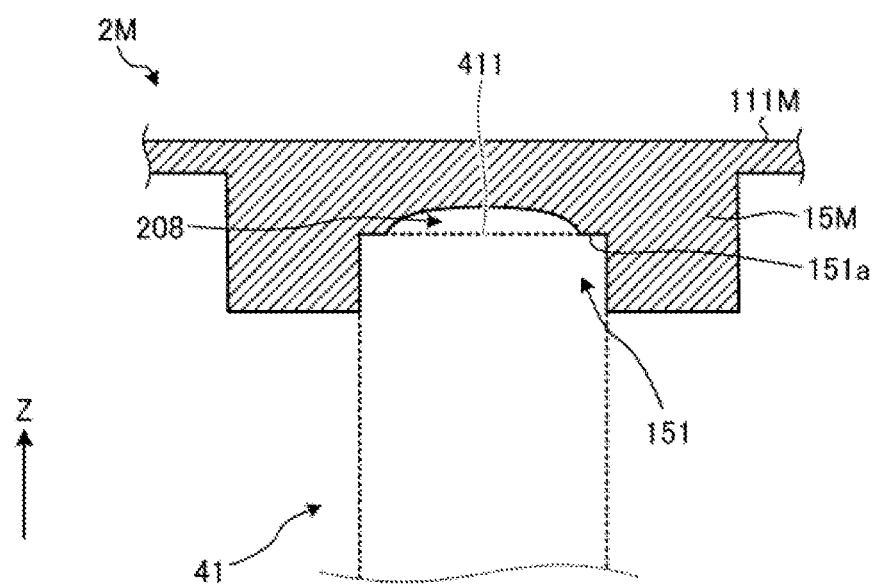
FIG. 27 is a schematic cross-sectional view of a structure according to a 13th modification example.

Next, a structure according to a 13th modification example will be described with reference to FIG. 27. FIG. 27 is a schematic cross-sectional view of the structure according to the 13th modification example.

As illustrated in FIG. 27, a structure 2M according to the 13th modification example includes a first electrode layer 111M. A contact portion 15M of the first electrode layer 111M according to the 13th modification example has a gap 208 between a part of a bottom surface 151a in the recessed portion 151 and a part of the tip surface 411 in the terminal 41. In this way, by having the gap 208, thermal conduction from the first electrode layer 111M to the terminal 41 can be suppressed. Thus, the heat generated in the first electrode layer 111M can be efficiently transferred to the wafer.

14th Modification Example

Figure 28:
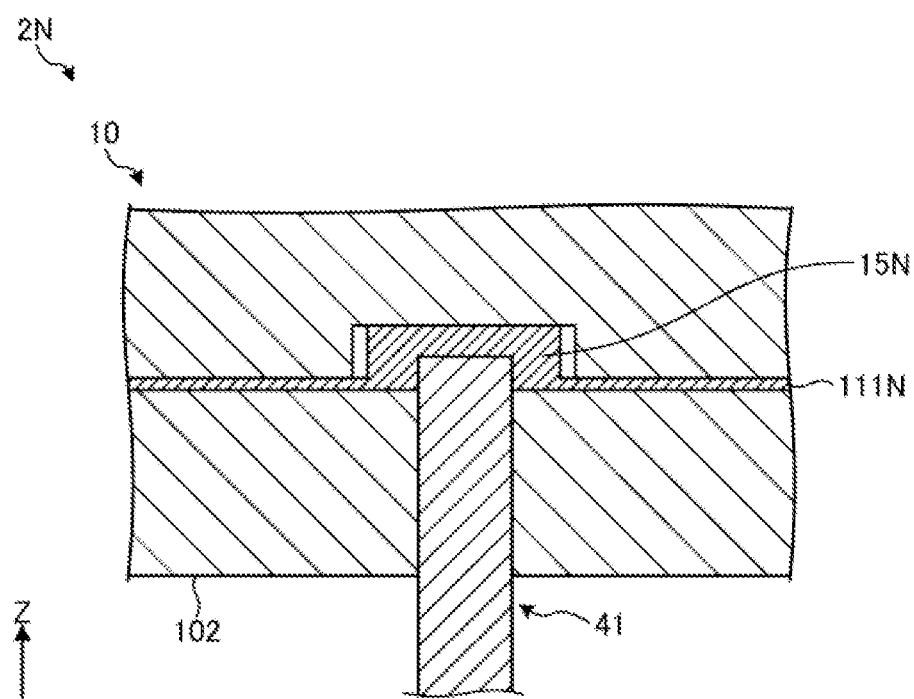
FIG. 28 is a schematic cross-sectional view of a structure according to a 14th modification example.

Next, a structure according to a 14th modification example will be described with reference to FIG. 28. FIG. 28 is a schematic cross-sectional view of the structure according to the 14th modification example.

As illustrated in FIG. 28, a structure 2N according to the 14th modification example includes a first electrode layer 111N. A contact portion 15N of the first electrode layer 111N according to the 14th modification example protrudes toward the wafer placement surface 101 (see FIG. 2) side compared to other portions of the first electrode layer 111N. In this way, the contact portion 15N does not need to protrude toward the lower surface 102 of the base 10 like the contact portion 15 illustrated in FIG. 3, for example, but may protrude toward the wafer placement surface 101.

15th Modification Example

Figure 29:
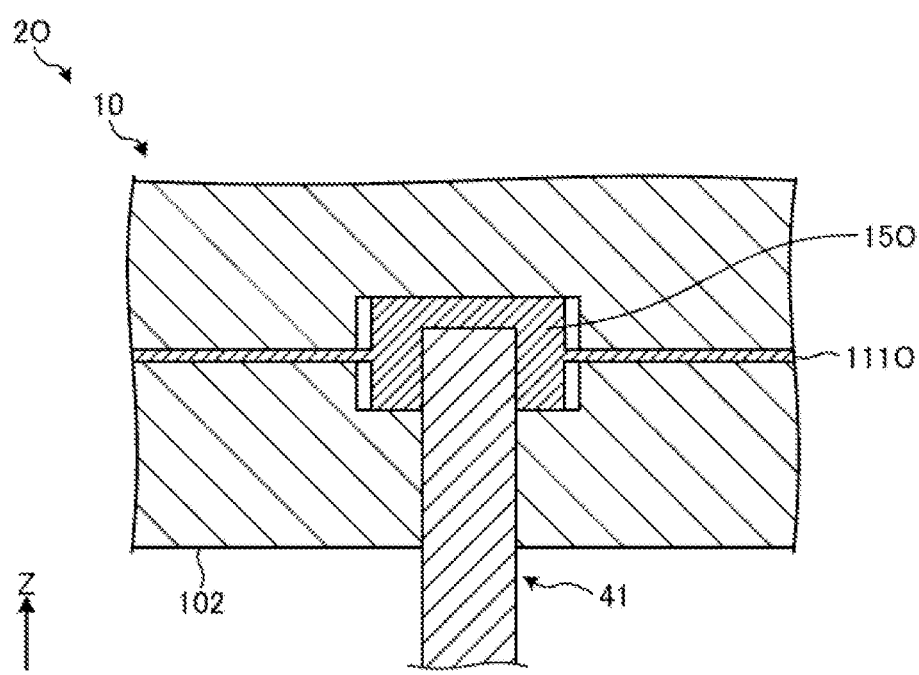
FIG. 29 is a schematic cross-sectional view of a structure according to a 15th modification example.

Next, a structure according to a 15th modification example will be described with reference to FIG. 29. FIG. 29 is a schematic cross-sectional view of the structure according to the 15th modification example.

As illustrated in FIG. 29, a structure 2O according to the 15th modification example includes a first electrode layer 111O. A contact portion 15O of the first electrode layer 111O according to the 15th modification example protrudes toward the wafer placement surface 101 (see FIG. 2) side of the base 10 as well as toward the lower surface 102 side of the base 10 compared with other portions of the first electrode layer 111O. In this way, the contact portion 15O may protrude toward both the wafer placement surface 101 and the lower surface 102. This makes it possible to increase the contact area between the terminal 41 and the contact portion 15O. Thus, the bonding strength between the terminal 41 and the first electrode layer 111O can be further improved.

16th Modification Example

Figure 30:
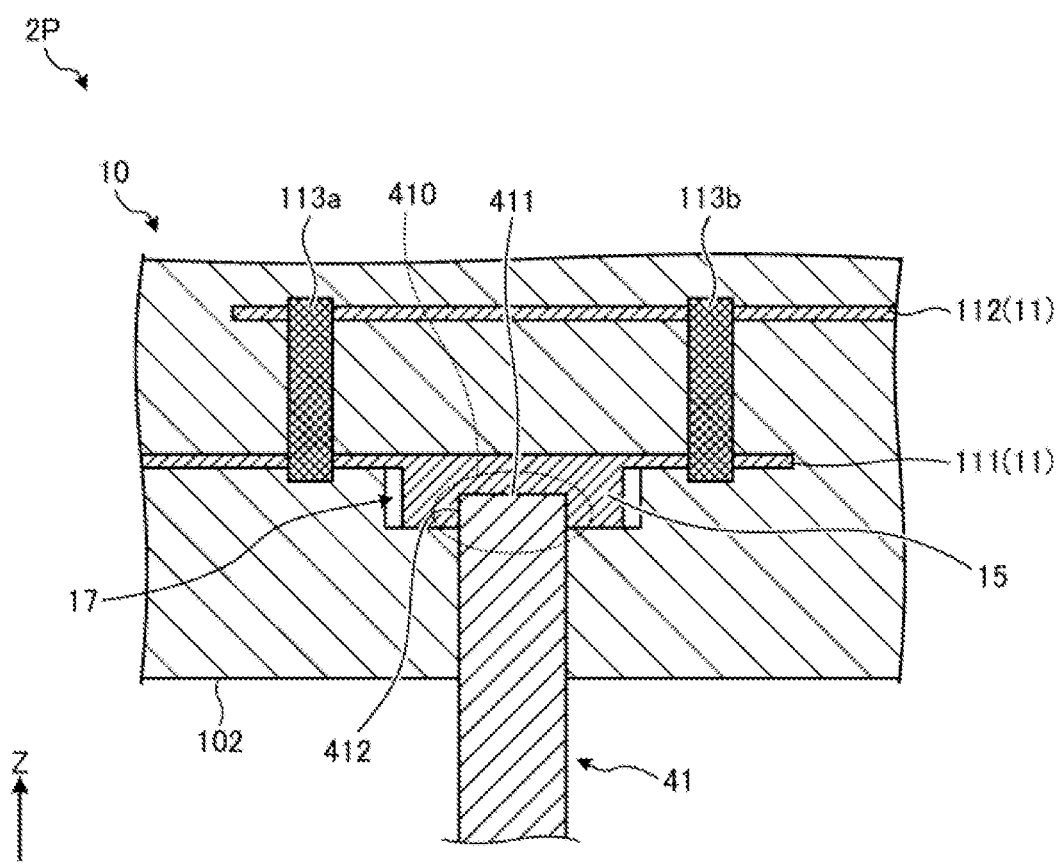
FIG. 30 is a schematic cross-sectional view of a structure according to a 16th modification example.

Next, a structure according to a 16th modification example will be described with reference to FIG. 30. FIG. 30 is a schematic cross-sectional view of the structure according to the 16th modification example.

As illustrated in FIG. 30, a structure 2P according to the 16th modification example includes a first via conductor 113a and a second via conductor 113b.

In this way, by connecting the first electrode layer 111 and the second electrode layer 112 using a plurality of via conductors (first via conductor 113a and second via conductor 113b), it is possible to make the electrical connection between the first electrode layer 111 and the second electrode layer 112 more secure.

Further, when the structure 2P is used, the first electrode layer 111 and the second electrode layer 112 expand or contract in the horizontal direction (direction along the wafer placement surface 101) due to changes in temperature. Such deformation of the first electrode layer 111 and the second electrode layer 112 may cause cracks in the base 10. In contrast, in the structure 2P according to the 16th modification example, the first electrode layer 111 and the second electrode layer 112 are connected by the plurality of via conductors (first via conductor 113a and second via conductor 113b). Thus, according to the structure 2P according to the 16th modification example, thermal deformation of the first electrode layer 111 and the second electrode layer 112 can be suppressed by the plurality of via conductors. Thus, it is possible to suppress cracks in the base 10.

Moreover, the first via conductor 113a and the second via conductor 113b are located on both sides of the contact portion 15, respectively. For example, in the example illustrated in FIG. 30, the first via conductor 113a is located on the left side of the contact portion 15 on the paper surface, and the second via conductor 113b is located on the right side of the contact portion 15 on the paper surface. In this way, by having the first via conductor 113a and the second via conductor 113b located on both sides of the contact portion 15, thermal deformation of the first electrode layer 111 and the second electrode layer 112, especially around the contact portion 15, can be suppressed. Thus, for example, when the structure 2P is used, it is possible to suppress separation of the terminal 41 from the first electrode layer 111 due to thermal deformation of the first electrode layer 111 and the second electrode layer 112. In other words, it is possible to increase the bonding strength between the terminal 41 and the first electrode layer 111 in an operation environment in which the temperature is repeatedly raised and lowered.

17th Modification Example

Figure 31:
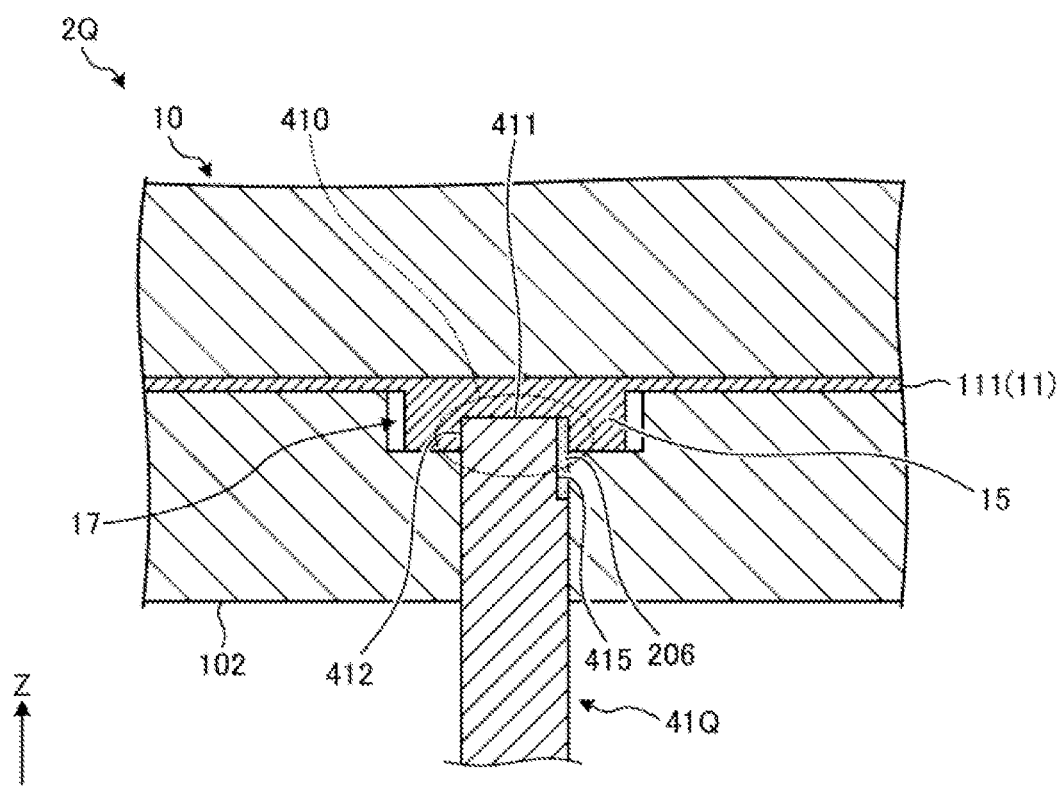
FIG. 31 is a schematic cross-sectional view of a structure according to a 17th modification example.
Figure 32:
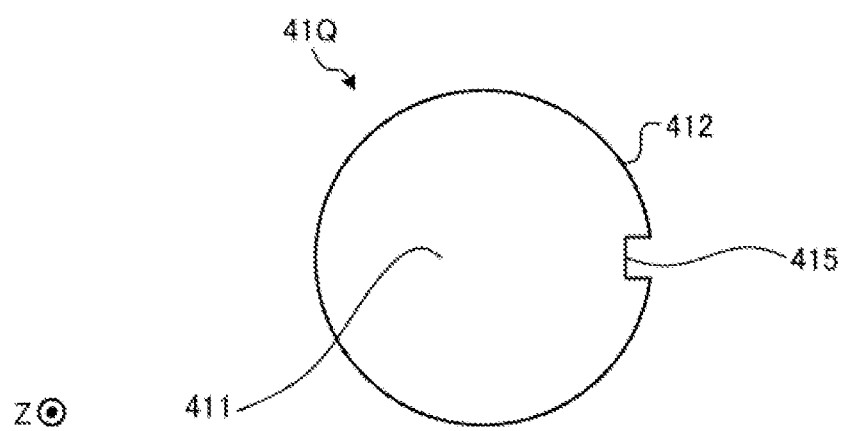
FIG. 32 is a schematic top view of a terminal according to the 17th modification example.

Next, a structure according to a 17th modification example will be described with reference to FIGS. 31 and 32. FIG. 31 is a schematic cross-sectional view of the structure according to the 17th modification example. FIG. 32 is a schematic top view of a terminal according to the 17th modification example.

As illustrated in FIG. 31, a structure 2Q according to the 17th modification example includes a terminal 41Q. As illustrated in FIGS. 31 and 32, the terminal 41Q has a recessed portion 415 on the side surface 412. The recessed portion 415 is provided at the tip portion 410 of the terminal 41Q. Specifically, on the side surface 412 of the terminal 41Q, the recessed portion 415 is continuously provided from a portion facing the contact portion 15 to a portion facing the base 10.

The sealant 206 enters such a recessed portion 415. In other words, the recessed portion 415 is filled with the sealant 206.

In this way, by allowing the sealant 206 to enter the recessed portion 415, the bonding strength between the terminal 41Q and the base 10 can be improved. In addition, by allowing the sealant 206 to enter the recessed portion 415, the bonding strength between the terminal 41Q and the contact portion 15 can be improved. Further, even when more than the required amount of the sealant 206 (e.g., Pt (platinum)) is applied in the manufacturing process, the excess sealant 206 accumulates in the recessed portion 415, thereby suppressing seepage of the sealant 206 from the lower surface 102 of the base 10 during manufacturing, for example.

Note that, although a case in which the terminal 41Q has one recessed portion 415 is illustrated here, the number of recessed portions 415 possessed by the terminal 41Q may be two or more. In addition, the recessed portion 415 may extend from the tip surface 411 to a base end surface of the terminal 41Q.

18th Modification Example

Figure 33:
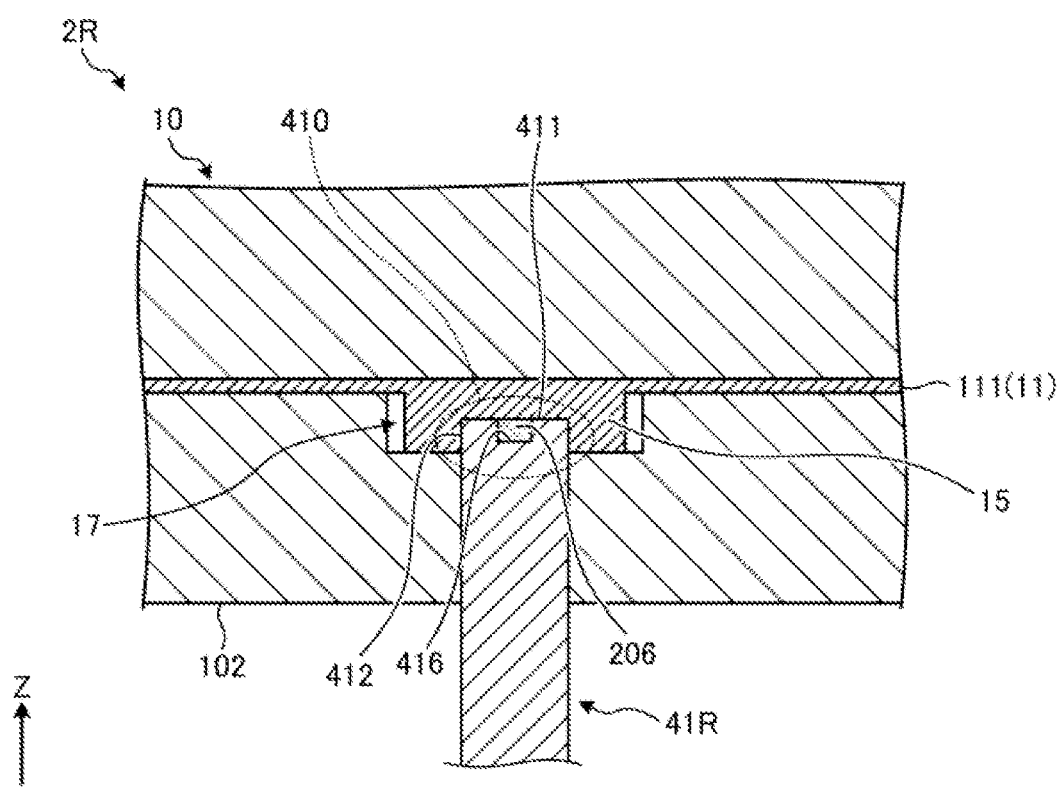
FIG. 33 is a schematic cross-sectional view of a structure according to an 18th modification example.
Figure 34:
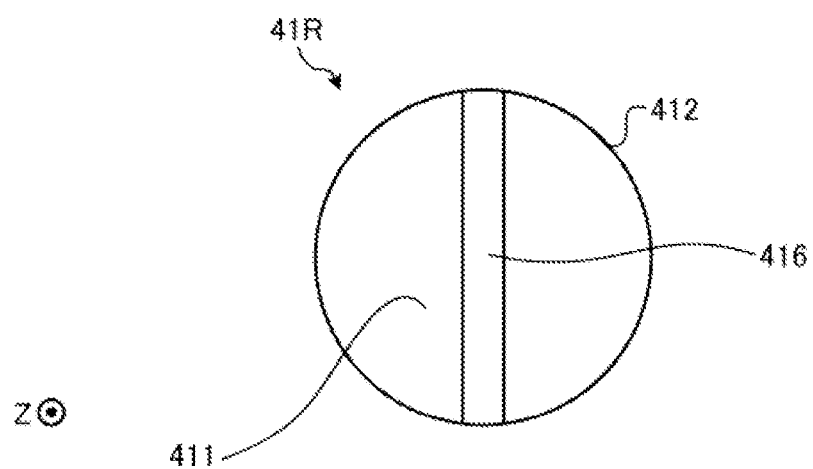
FIG. 34 is a schematic top view of a terminal according to the 18th modification example.

Next, a structure according to an 18th modification example will be described with reference to FIGS. 33 and 34. FIG. 33 is a schematic cross-sectional view of the structure according to the 18th modification example. FIG. 34 is a schematic top view of a terminal according to the 18th modification example.

As illustrated in FIG. 33, a structure 2R according to the 18th modification example includes a terminal 41R. As illustrated in FIGS. 33 and 34, the terminal 41R has a recessed portion 416 on the tip surface 411. The recessed portion 416 is provided at the tip portion 410 of the terminal 41R. Specifically, the recessed portion 416 is provided on the tip surface 411 of the terminal 41R. Both ends of the recessed portion 416 reach the side surface 412 of the terminal 41R. Note that, although a case in which the terminal 41R has one recessed portion 416 is illustrated here, the terminal 41R may have a plurality of recessed portions 416. For example, the terminal 41R may have two recessed portions 416 that intersect in a cross. The terminal 41R may further have a recessed portion 415 similar to the recessed portion 415 possessed by the terminal 41Q according to the 17th modification example. In this case, the recessed portion 415 and the recessed portion 416 may be contiguous.

In such a recessed portion 416, the sealant 206 is entered. In other words, the recessed portion 416 is filled with the sealant 206.

In this way, by allowing the sealant 206 to enter the recessed portion 416, the bonding strength between the terminal 41R and the base 10 can be improved. In addition, by allowing the sealant 206 to enter the recessed portion 416, the bonding strength between the terminal 41R and the contact portion 15 can be improved. Further, even when more than the required amount of the sealant 206 (e.g., Pt (platinum)) is applied in the manufacturing process, the excess sealant 206 accumulates in the recessed portion 416, thereby suppressing seepage of the sealant 206 from the lower surface 102 of the base 10 during manufacturing, for example.

As described above, the structures (e.g., structures 2, 2A to 2P) according to the respective embodiments include the respective bases (e.g., 10, 10A), the respective electrode layers (e.g., first electrode layers 111, 111C, 111D, 111F, 111M, 111N, 111O), and the respective terminals (e.g., terminals 41, 41G, 41H, 41I, 41J, 41K, 41L). The base is made of a ceramic. The electrode layer is located inside the base. The terminal is electrically connected to the electrode layer at the tip portion of the terminal. Further, the terminals are in contact with the respective electrode layers at the respective tip surfaces (e.g., tip surfaces 411, 411G, 411H, 411I, 411J, 411K) of the terminals and the respective side surfaces (e.g., side surfaces 412, 412G, 412H, 412J, 412K) of the terminals. Thus, according to the structures according to the respective embodiments, the bonding strength between the terminal and the electrode layer can be improved.

The electrode layers may have the respective contact portions (e.g., contact portions 15, 15C, 15D, 15E, 15F, 15M, 15N, 15O) with the respective terminals. In this case, each of the contact portions may be thicker than the other portions in the electrode layer. By making the contact portion, which is the portion in contact with the terminal, thicker than the other portions in the electrode layer, the contact area with the side surface of the terminal can be made larger. Thus, the bonding strength between the terminal and the electrode layer can be further improved.

The electrode layer may have the recessed portion (e.g., recessed portion 151) in a part of the contact portion that is recessed in the thickness direction of the contact portion. In this case, the tip portion of the terminal may be located inside the recessed portion. Since the contact portion is thickly formed, when the recessed portion is formed in the contact portion using a drill or the like in the manufacturing process of the base, the likelihood of the drill or the like accidentally passing through the electrode layer can be reduced. That is, the manufacturing process of the base can be facilitated.

The structure according to the embodiment (e.g., structure 2M) may have the gap (e.g., gap 208) between a part of the bottom surface of the recessed portion and a part of the tip surface of the terminal. This makes it possible to suppress thermal conduction from the electrode layer to the terminal.

The electrode layer (e.g., electrode layer 111F) may be curved toward the terminal at least in the region including the contact portion. This makes it easier for the electrode layer to resist the pressing force by the terminal, thereby ensuring a more secure bond between the terminal and the electrode layer.

The bases (e.g., bases 10, 10A) may have the respective spaces (e.g., spaces 17, 17A) around the contact portion. This makes it possible to suppress thermal conduction in the direction in which the space is present due to the insulating effect of the space.

The space (e.g., space 17A) may extend to the side and in the protruding direction of the contact portion. This makes it possible to further suppress thermal conduction in the direction in which the space is present.

The terminal (e.g., terminal 41J) may have a shape that decreases in diameter toward the tip surface (e.g., tip surface 411J). This makes it possible to increase the contact area between the tip portion of the terminal and the contact portion. Thus, the bonding strength between the terminal and the electrode layer can be further improved.

The terminal (e.g., terminal 41K) may have a shape that increases in diameter toward the tip surface (e.g., tip surface 411K). This makes it possible to increase the contact area between the tip portion of the terminal and the contact portion. Thus, the bonding strength between the terminal and the electrode layer can be further improved. In addition, the reverse tapered shape suppresses the separation of the terminal.

The tip surface (e.g., tip surface 411I) of the terminal (e.g., terminal 41I) may be curved. This makes it possible to increase the contact area between the tip portion of the terminal and the contact portion. Thus, the bonding strength between the terminal and the electrode layer can be further improved.

In the above-described embodiments, the wafer placement device has been described as an example of the heating device, but the heating device according to the present disclosure is not limited to the wafer placement device as long as heat is generated in the electrode layer inside the base to heat an object (e.g., an object placed on one side of the base).

Additional effects and variations can be easily derived by a person skilled in the art. Thus, a wide variety of aspects of the present invention are not limited to the specific details and representative embodiments represented and described above. Accordingly, various changes are possible without departing from the spirit or scope of the general inventive concepts defined by the appended claims and their equivalents.

REFERENCE SIGNS LIST

1: Wafer placement device
2: Structure
4: Wiring portion
5: Electric power supply unit
6: Controller
10: Base
11: Electrode layer
15: Contact portion
17: Space
20: Shaft
41: Terminal
42: Lead wire
101: Upper surface (wafer placement surface)
102: Lower surface
111: First electrode layer
112: Second electrode layer
113: Via conductor
113a: First via conductor
113b: Second via conductor
151: Recessed portion
152: Side surface
153: Protruding surface
201: Ceramic green sheet
202: Metal sheet
203: Opening
204: Paste
205: Opening
206: Sealant
208: Gap
410: Tip portion
411: Tip surface
412: Side surface

The invention claimed is:

1. A structure comprising:
a base made of a ceramic;
an electrode layer located inside the base; and
a terminal electrically connected to the electrode layer at a tip portion of the terminal, wherein
the terminal is in contact with the electrode layer at a tip surface of the terminal and a side surface of the terminal,
the electrode layer has a contact portion with the terminal,
the contact portion is thicker than other portions in the electrode layer,
the contact portion includes:
  a first surface that is in contact with a tip portion of the terminal;
  a second surface that is on an opposite side of the first surface and parallel to the first surface and not in contact with the terminal;
  a third surface that is perpendicular to the first and second surfaces and comprises a portion that is between the first surface and the second surface, and
  a space is interposed between at least the portion of the third surface between the first surface and the second surface and the base.

2. The structure according to claim 1, wherein
the electrode layer has a recessed portion in a part of the contact portion that is recessed in a thickness direction of the contact portion, and
the tip portion of the terminal is located inside the recessed portion.

3. The structure according to claim 2, wherein a gap is provided between a part of a bottom surface in the recessed portion and a part of the tip surface in the terminal.

4. The structure according to claim 1, wherein the electrode layer is curved toward the terminal at least in a region including the contact portion.

5. The structure according to claim 1, wherein the space extends laterally and in a protruding direction of the contact portion.

6. The structure according to claim 1, wherein the terminal has a shape that decreases in diameter toward the tip surface.

7. The structure according to claim 1, wherein the terminal has a shape that increases in diameter toward the tip surface.

8. The structure according to claim 1, wherein the tip surface of the terminal is curved.

9. The structure according to claim 1, wherein the terminal has a recessed portion on the side surface of the tip portion.

10. The structure according to claim 1, wherein the terminal has a recessed portion on the tip surface.

11. The structure according to claim 1, wherein the structure is a heating device configured to heat an object by generating heat in the electrode layer.

12. A heating device comprising:
the structure according to claim 1; and
an electric power supply unit configured to heat the electrode layer by supplying electric power to the electrode layer.

13. A structure comprising:
a base made of a ceramic;
an electrode layer located inside the base; and
a terminal electrically connected to the electrode layer at a tip portion of the terminal, wherein
the terminal is in contact with the electrode layer at a tip surface of the terminal and a side surface of the terminal,
the electrode layer has a contact portion with the terminal,
the electrode layer has a recessed portion in a part of the contact portion that is recessed in a thickness direction of the contact portion,
the tip portion of the terminal is located inside the recessed portion,
a gap is provided between a part of a bottom surface in the recessed portion and a part of the tip surface in the terminal,
the contact portion is thicker than other portions in the electrode layer,
the contact portion includes:
a first surface that is in contact with a tip portion of the terminal;
a second surface that is on an opposite side of the first surface;
a third surface that is a side surface between the first surface and the second surface, and
a space is interposed between the side surface and the base.

* * * * *